(12) United States Patent
Zhang et al.

(10) Patent No.: US 9,999,134 B2
(45) Date of Patent: Jun. 12, 2018

(54) SELF-DECAP CAVITY FABRICATION PROCESS AND STRUCTURE

(71) Applicant: Multek Technologies Limited, San Jose, CA (US)

(72) Inventors: Mark Zhang, Guangdong (CN); Kwan Pen, Guangdong (CN); Pui Yin Yu, Tsuen Wan (HK)

(73) Assignee: Multek Technologies Limited, San Jose, CA (US)

( * ) Notice: Subject to any disclaimer, the term of this patent is extended or adjusted under 35 U.S.C. 154(b) by 0 days. days.

(21) Appl. No.: 15/081,623

(22) Filed: Mar. 25, 2016

(65) Prior Publication Data

US 2017/0265298 A1    Sep. 14, 2017

(30) Foreign Application Priority Data

Mar. 14, 2016   (CN) .......................... 2016 1 0143995

(51) Int. Cl.
| | |
|---|---|
| H05K 1/03 | (2006.01) |
| H05K 3/04 | (2006.01) |
| H05K 1/18 | (2006.01) |
| H05K 3/46 | (2006.01) |
| H05K 3/00 | (2006.01) |

(52) U.S. Cl.
CPC ............. *H05K 3/048* (2013.01); *H05K 1/183* (2013.01); *H05K 1/036* (2013.01); *H05K 3/0035* (2013.01); *H05K 3/0044* (2013.01); *H05K 3/4697* (2013.01); *H05K 2201/0187* (2013.01); *H05K 2201/0989* (2013.01); *H05K 2201/09109* (2013.01); *H05K 2203/0228* (2013.01); *H05K 2203/1383* (2013.01)

(58) Field of Classification Search
USPC ........................................ 174/255, 250, 256
See application file for complete search history.

(56) References Cited

U.S. PATENT DOCUMENTS

| | | |
|---|---|---|
| 3,739,232 A | 6/1973 | Grossman |
| 3,755,061 A | 8/1973 | Schurb |
| 3,834,823 A | 9/1974 | Seregely |
| 4,055,424 A | 10/1977 | Chu |

(Continued)

FOREIGN PATENT DOCUMENTS

| | | |
|---|---|---|
| JP | 2008078454 A | 4/2008 |
| JP | 2015012022 A | 1/2015 |

(Continued)

OTHER PUBLICATIONS

Non-Final office Action dated Nov. 1, 2017, U.S. Appl. No. 15/367,679, filed Dec. 2, 2016, applicant: Joan K. Vrtis, 28 pages.

*Primary Examiner* — Andargie M Aychillhum
(74) *Attorney, Agent, or Firm* — Haverstock & Owens LLP

(57) ABSTRACT

A PCB having multiple stacked layers laminated together. The laminated stack includes regular flow prepreg and includes a recessed cavity, a bottom perimeter of which is formed by a photo definable, or photo imageable, polymer structure, such as a solder mask frame, and a protective film. The solder mask frame and protective film protect inner core circuitry at the bottom of the cavity during the fabrication process, as well as enable the use of regular flow prepreg in the laminated stack.

19 Claims, 4 Drawing Sheets

(56) References Cited

U.S. PATENT DOCUMENTS

| | | |
|---|---|---|
| 4,165,557 A | 8/1979 | Taguchi |
| 4,338,149 A | 7/1982 | Quaschner |
| 4,447,286 A | 5/1984 | Weglin |
| 4,518,833 A | 5/1985 | Watkins |
| 4,568,629 A | 2/1986 | Kinashi |
| 4,670,351 A | 6/1987 | Keane |
| 4,711,026 A | 12/1987 | Swiggett |
| 4,795,512 A | 1/1989 | Nakatani |
| 4,828,961 A | 5/1989 | Lau |
| 4,837,408 A | 6/1989 | Kondo |
| 4,941,516 A | 7/1990 | Weiswurm |
| 5,004,639 A | 4/1991 | Desai |
| 5,116,440 A | 5/1992 | Takeguchi |
| 5,121,297 A | 6/1992 | Haas |
| 5,153,050 A | 10/1992 | Johnston |
| 5,175,047 A | 12/1992 | McKenney |
| 5,206,463 A | 4/1993 | DeMaso |
| 5,227,223 A | 7/1993 | Morgan |
| 5,347,712 A | 9/1994 | Yasuda |
| 5,409,884 A | 4/1995 | Harada |
| 5,784,782 A | 7/1998 | Boyko |
| 5,876,859 A | 3/1999 | Saxelby, Jr. |
| 6,031,281 A | 2/2000 | Kang |
| 6,090,237 A | 7/2000 | Reynolds |
| 6,214,525 B1 | 4/2001 | Boyko |
| 7,037,561 B2 | 5/2006 | Narita |
| 7,898,068 B2 | 3/2011 | Smeys |
| 8,020,291 B2 | 9/2011 | Kumar |
| 8,278,565 B2* | 10/2012 | Honjo .................... H05K 1/183 174/261 |
| 8,519,270 B2 | 8/2013 | Chang |
| 8,558,116 B2 | 10/2013 | Lee et al. |
| 8,735,739 B2 | 5/2014 | Ishihara |
| 8,882,954 B2 | 11/2014 | Lee et al. |
| 8,884,166 B2 | 11/2014 | Inatani |
| 2004/0089472 A1 | 5/2004 | Ninomiya |
| 2004/0219342 A1 | 11/2004 | Boggs |
| 2005/0005996 A1 | 1/2005 | Mizutani |
| 2006/0043567 A1 | 3/2006 | Palanduz |
| 2007/0017697 A1 | 1/2007 | Hsu |
| 2007/0054104 A1 | 8/2007 | Kimoto |
| 2007/0246254 A1 | 10/2007 | Kumar |
| 2009/0004438 A1 | 1/2009 | Urakawa |
| 2009/0257707 A1 | 10/2009 | Shibata |
| 2010/0159765 A1 | 6/2010 | Jian |
| 2010/0288540 A1 | 11/2010 | Honjo |
| 2011/0135248 A1 | 6/2011 | Langer |
| 2011/0163457 A1 | 7/2011 | Mohan |
| 2012/0181074 A1 | 7/2012 | Ishihara |
| 2013/0299223 A1 | 11/2013 | Yoo |
| 2013/0341078 A1 | 12/2013 | Hardin |
| 2014/0024147 A1* | 1/2014 | Xie .................... B81C 1/00158 438/21 |
| 2014/0301053 A1 | 10/2014 | Lida |
| 2015/0090688 A1 | 4/2015 | Ajojan |
| 2015/0376444 A1 | 12/2015 | Saito |
| 2016/0088729 A1 | 3/2016 | Kobuke |
| 2016/0324012 A1 | 11/2016 | Qiu |
| 2017/0118879 A1 | 4/2017 | Nakanishi |
| 2017/0265298 A1 | 9/2017 | Zhang |

FOREIGN PATENT DOCUMENTS

| | | |
|---|---|---|
| KR | 10-0887133 B1 | 3/2009 |
| KR | 100891814 | 3/2009 |
| KR | 10-0891814 B1 | 4/2009 |

* cited by examiner

SELF-DECAP CAVITY FABRICATION PROCESS AND STRUCTURE

CROSS-REFERENCE TO RELATED APPLICATION(S)

This application claims priority under 35 U.S.C. § 119 (a)-(d) of the Chinese Patent Application No: 201610143995.6, filed Mar. 14, 2016 and titled, "SELF-DECAP CAVITY FABRICATION PROCESS AND STRUCTURE," which is hereby incorporated by reference in its entirety for all purposes.

FIELD OF THE INVENTION

The present invention is generally directed to printed circuit boards. More specifically, the present invention is directed to printed circuit boards having recessed cavities.

BACKGROUND OF THE INVENTION

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate. Conductors on different layers are interconnected with plated-through holes called vias.

A printed circuit board includes a plurality of stacked layers, the layers made of alternating non-conductive layers and conductive layers. The non-conductive layers can be made of prepreg or base material that is part of a core structure, or simply core. Prepreg is a fibrous reinforcement material impregnated or coated with a resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material on one or both sides. A laminated stack is formed by stacking multiple core structures with intervening prepreg and then laminating the stack. A via is then formed by drilling a hole through the laminated stack and plating the wall of the hole with electrically conductive material, such as copper. The resulting plating interconnects the conductive layers in the laminated stack.

In order to lower overall board thickness after assembly, inclusion of a recessed cavity in the PCB is getting more attention in consumer electronic and telecommunication products. Common fabrication process is to pre-cut low flow prepreg at a cavity area and then control resin squeeze out during the lamination process. This process has disadvantages such as high cost of low flow prepreg, limited supply of low flow prepreg and difficulty in controlling resin squeeze out into the cavity. Additionally, lamination accessories such as release film and conformal film are needed which also add cost. Release film provides a separation between a surface copper layer (conducting layer) in the lamination stack and the conformal film. Conformal film is a thermoplastic layer which softens under lamination temperature and conforms to the area with prepreg pre-cut. Use of low flow prepreg requires higher lamination pressure. Lamination under high pressure and the impact of conformal film can result in increased panel distortion and it is difficult to achieve flat surface for fine line etching or even dielectric thickness across the panel to control impedance. A panel here refers to the finished product of the stack of laminate and prepreg after lamination. In order to solve these issues, a new manufacturing process for forming a cavity within a PCB is needed.

SUMMARY OF THE INVENTION

Embodiments are directed to a PCB having a recessed cavity having a photo definable, or photo imageable, polymer structure and a protective film at a bottom perimeter of the cavity side wall. The PCB has multiple stacked layers laminated together. The laminated stack includes regular flow prepreg and includes a recessed cavity. The polymer structure is applied on a surface of a core structure, on top of which is to be formed a cavity area, and then exposed and developed. The protective film is laminated to the polymer structure which prevents direct contact of prepreg and a bottom surface of the subsequent cavity area in the lamination process. After lamination, a decap process is performed to remove a portion of the laminated stack, the portion referred to as a plug, corresponding to the cavity area. The decap process can include mechanical routing, laser routing or mechanical plus laser routing at a cavity boundary and the plug is pulled out, thereby forming the cavity. In this process, there is no need to control resin squeeze out nor a limitation in prepreg selection. Further, without use of lamination accessories or high lamination pressure, panel distortion and surface flatness are improved.

In an aspect, a printed circuit board is disclosed. The printed circuit board includes a laminated stack, a photo imageable polymer structure and a protective film. The laminated stack comprises a plurality of non-conductive layers and a plurality of conductive layers. A recessed cavity is formed in the laminated stack, the recessed cavity having cavity side walls and a cavity bottom surface. Inner core circuitry is formed on the cavity bottom surface. The photo imageable polymer structure is formed within the laminated stack, wherein the photo imageable structure forms a perimeter boundary of the recessed cavity within the cavity side walls adjacent to the cavity bottom surface. The protective film is positioned on the photo imageable polymer structure and formed within the laminated stack. In some embodiments, the recessed cavity is formed from an outer surface of the laminated stack into the laminated stack. In some embodiments, the photo imageable polymer structure is a solder mask frame. In some embodiments, the photo imageable polymer structure is formed on a surface of one of the plurality of conductive layers. In some embodiments, the one of the plurality of conductive layers on which the photo imageable polymer structure is formed comprises a first portion on which the photo imageable polymer structure is formed and a second portion comprising the inner core circuitry. In some embodiments, the protective film is polyimide. In some embodiments, one or more of the plurality of non-conductive layers comprise a prepreg layer. In some embodiments, the prepreg layer comprises a regular flow prepreg layer having resin flow greater than about 100 mil. In some embodiments, each of the conductive layers is pattern etched. In some embodiments, the printed circuit board further comprises one or more plated through hole vias in the laminated stack.

In another aspect, a method of manufacturing a printed circuit board is disclosed. The method includes forming an inner core structure having a first surface of conductive material, wherein a first portion of the conductive material is pattern etched to form inner core circuitry. The method also includes forming a photo imageable polymer structure on a second portion of the conductive material of the inner core structure. The photo imageable polymer structure forms a lateral boundary within which a footprint of a recessed cavity is to be formed. The method also includes laminating a protective film to the photo imageable polymer structure, wherein the protective film covers the inner core circuitry. The method also includes forming a printed circuit board stack up, wherein the printed circuit board stack up comprises the inner core structure, a plurality of non-conductive layers and a plurality of conductive layers. The method also includes laminating the printed circuit board stack up, thereby forming a laminated stack. The method also includes forming a depth controlled rout from a surface of the laminated stack to the first portion of conductive material and within the lateral boundary of the photo imageable polymer structure. A portion of the laminated stack within a perimeter of the rout and to the depth of the rout forms a laminated stack plug. The method also includes removing the laminated stack plug, thereby forming the recessed cavity and exposing the inner core circuitry at a bottom surface of the recessed cavity. In some embodiments, there is a gap between the protective film and the inner core circuitry during and after laminating the protective film to the photo imageable polymer structure. In some embodiments, an outer perimeter of the protective film substantially matches an outer perimeter of the photo imageable polymer structure. In some embodiments, an outer perimeter of the protective film is within an outer perimeter of the photo imageable polymer structure. In some embodiments, the method also includes laser trimming an outer edge of the protective film after laminating the protective film to the photo imageable polymer structure. In some embodiments, the method also includes forming at least one plated through hole via in the laminated stack, wherein the at least one plated through hole via is not aligned within the cavity. In some embodiments, the method also includes pattern etching one or more of the plurality of conductive layers in the laminated stack prior to forming the printed circuit board stack up. In some embodiments, forming the inner core structure comprises applying a first conductive layer on a first surface of a non-conductive layer. In some embodiments, the first conductive layer is pattern etched thereby forming the first portion of conductive material onto which the photo imageable polymer structure is formed and the second portion comprising the inner core circuitry. In some embodiments, one or more of the non-conductive layers comprise one or more regular flow prepreg layers. In some embodiments, laminating the printed circuit board stack up comprises applying a standard lamination pressure less than about 450 psi. In some embodiments, forming the inner core structure further comprises applying a solder mask to the inner core circuitry.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a printed circuit board. Those of ordinary skill in the art will realize that the following detailed description of the printed circuit board is illustrative only and is not intended to be in any way limiting. Other embodiments of the printed circuit board will readily suggest themselves to such skilled persons having the benefit of this disclosure.

Reference will now be made in detail to implementations of the printed circuit board as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
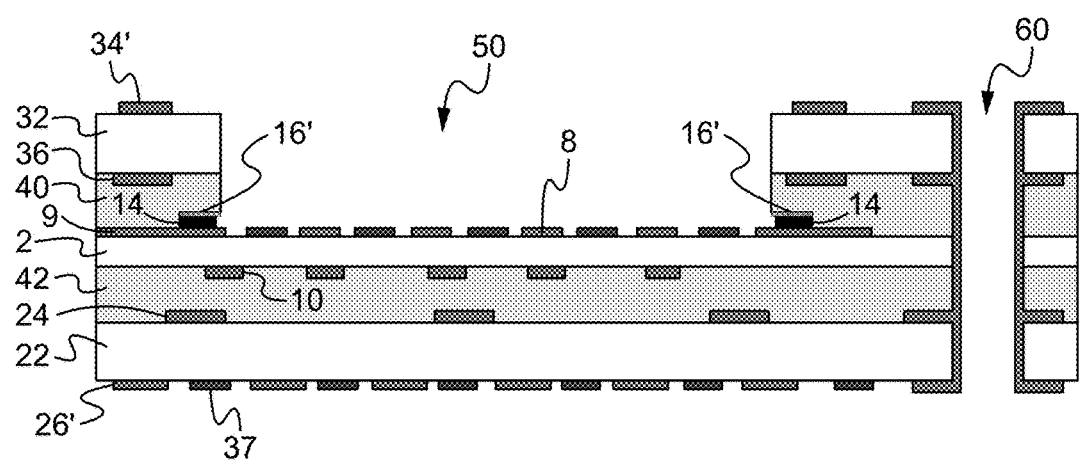
FIG. 1 illustrates a cut-out side view of a PCB including a recessed cavity according to some embodiments.

FIG. 1 illustrates a cut out side view of a PCB including a recessed cavity according to some embodiments. The PCB is a laminated stack having a plurality of non-conductive layers and a plurality of conductive layers. In the exemplary configuration shown in FIG. 1, the PCB includes conductive layers 8, 9, 10, 24, 26', 34' and 36, and non-conductive layers 2, 22, 32, 40 and 42. Each conductive layer is patterned to form electrically conductive interconnects. Although not shown in FIG. 1, electrically conductive vias can be formed in the laminated stack to electrically interconnect one or more conductive layers. A conductive layer can be formed, for example, from a copper foil or laminate, where a laminate includes a non-conductive layer such as base material and a conductive layer on one or both sides of non-conductive layer. In some embodiments, a conductive layer is representative of a multilayer buildup that can include many interspersed conductive and non-conductive layers.

Each non-conductive layer is made of a non-conductive, insulating layer, such as prepreg or base material. The prepreg used herein is a regular flow prepreg, which enables a regular pressure to be used during a subsequent lamination step. In the PCB industry, "low flow" prepreg, such as that described in the background, is a general term to describe prepreg with lower resin flow than "regular flow" prepreg. "Low flow" prepreg usually has resin flow that is less than 100 mil. "Regular flow" prepreg has resin flow that is greater than 100 mil. A base material is an organic or inorganic material used to support a pattern of conductor material. Base material and prepreg each include resin and glass cloth, but the resin in base material is already fully cured and as such does not flow during lamination. The resin in prepreg is only partially cured and therefore flows during lamination. It is understood that the number of non-conductive layers and conductive layers shown in FIG. 1 is merely a design choice and that fewer or greater numbers of non-conductive layers and conductive layers can be included.

Prior to stack-up and lamination of the printed circuit board layers, a photo definable, or photo imageable, polymer structure is added onto a portion of one of the conductive layers. In some embodiments, the photo imageable polymer structure includes a resin, a photo-activator or photo-initiator, and cross-linking agents that upon being subject to light become solid and remain attached to an underlying substrate. Any material not subject to light is easily washed away. In some embodiments, photolithography is used as a process for forming the photo imageable polymer structure. It is understood that other conventional processes can be used. A specific example of a photo imageable polymer structure is a solder mask frame. A solder mask, also referred to as a solder stop mask or solder resist, is a thin layer of polymer. Solder mask comes in different media. One type of solder mask is epoxy liquid that is silkscreened through a pattern onto an underlying substrate. Other types are liquid photo imageable solder mask (LPSM) inks and dry film photo imageable solder mask (DFSM). Subsequent reference is made to a "solder mask frame", but it is understood that such teachings can generally be applied to other photo imageable polymer structures. In the exemplary configuration shown in FIG. 1, a solder mask frame 14 is applied to a surface of the conductive layer 9. However, depending on the design, the conductive layer 9 may not exist, in which case the solder mask frame 14 is applied to the non-conductive layer 2 directly. The solder mask frame 14 forms a perimeter within which a cavity 50 is formed. The solder mask frame 14 also functions as a stand upon which a protective film is mounted. During the fabrication process described below, the protective film provides a protective barrier between inner core circuitry, such as inner core circuitry 8 in FIG. 1, at the bottom of the cavity and overhead layers of the PCB stack-up. The protective film also enables means for removing these overhead layers to form the cavity. Removal of these overhead layers also removes a portion of the protective film co-located in the cavity area, but a remaining peripheral portion of the protective film remains. In the exemplary configuration shown in FIG. 1, the remaining peripheral portion of the protective film is shown as protective film 16' on the solder mask frame 14.

The protective film is positioned and laminated to the solder mask frame, thereby covering the inner core circuitry and the bottom of the to be formed cavity. In the intermediate fabrication of the printed circuit board, the protective film prevents direct contact of prepreg and the inner core circuitry in the lamination process. To ensure that the entire area of the cavity is formed, the solder mask frame and protective film are applied around and over an area that is slightly greater than the bottom surface area of the to be formed cavity. After lamination, a decap process is performed to remove a portion of the laminated stack, the portion referred to as a plug, corresponding to the cavity area. The decap process can include mechanical routing, laser routing or mechanical plus laser routing at a cavity boundary that is just within the inner edge of the solder mask frame, thereby enabling the plug to be free from surrounding material. The plug is pulled out from the surrounding laminated stack to form the cavity and expose the inner core circuitry at the cavity bottom surface. The cavity boundary is routed within a perimeter boundary of the protective film. As such, removal of the plug leaves intact a perimeter portion of the protective film laminated to the solder mask frame.

In the exemplary configuration shown in FIG. 1, a depth of the cavity 50 is a function of the thicknesses of the non-conductive layers 32 and 40. It is understood that the depth of the cavity can be varied by varying the thicknesses of the non-conductive layers 32 and 40 and/or by adding additional non-conductive layers between the protective film layer and the outer surface of the laminated stack into which the cavity is formed. A cross-sectional area of the cavity can be increased or decreased by increasing or decreasing the footprint of the solder mask frame and the area onto which the protective film layer is applied. Similarly, a cross-sectional shape of the cavity is determined by a shape of the perimeter formed by the solder mask frame and overlying protective film layer, for example as a rectangle or a circle.

Figure 2:
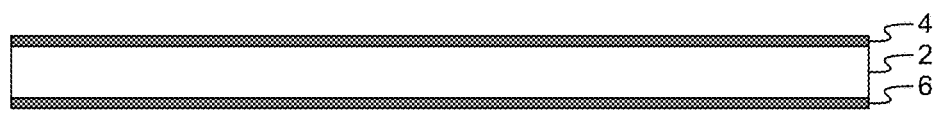
FIGS. 2-11 illustrate various steps in the process used to manufacture a PCB according to some embodiments.

FIGS. 2-11 illustrate various steps in the process used to manufacture a PCB having a recessed cavity according to some embodiments. The PCB manufactured using the various steps shown in FIGS. 2-11 is similar to and shares features of the PCB and constituent layers shown in FIG. 1. Each of the FIGS. 2-11 illustrate a cut out side view of the PCB according to the various process steps. In FIG. 2, an exemplary inner core structure is shown. The inner core structure is a metal clad structure including the non-conductive layer 2 and conductive layers 4, 6 formed on both opposing surfaces. It is understood that an alternative inner core structure can be used which includes a conductive layer on only one surface of the non-conductive layer.

Figure 3:
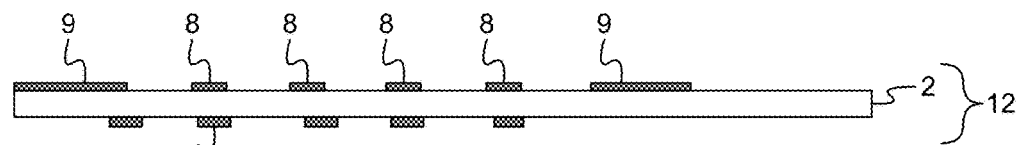

In FIG. 3, the conductive layer 4 is selectively pattern etched to form inner core circuitry 8 and patterned interconnects 9. The inner core circuitry 8 subsequently forms a portion of the bottom surface of the recessed cavity. The conductive layer 6 is selectively pattern etched to form patterned interconnects 10. Alternatively, the conductive layers 4, 6 are already pattern etched during fabrication of the inner core structure in FIG. 2. It is understood that FIG. 2-11 only show a portion of the PCB and in particular only show a portion of the inner core structure. Additional interconnects and circuitry may be formed on portions of the inner core structure not shown in FIGS. 2-11. The non-conductive layer 2, the inner core circuitry 8 and the patterned interconnects 9, 10 form inner core structure 12.

Figure 4:
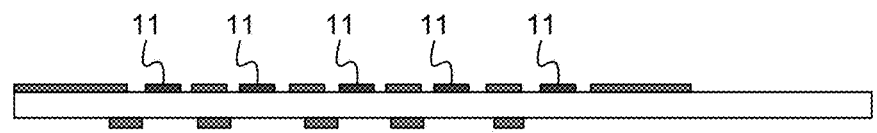

In FIG. 4, optional inner layer solder mask 11 is applied to the inner core circuitry 8. The inner layer solder mask prevents short-circuiting during a subsequent SMT (surface mount technology) process where components are mounted to the inner core circuitry of the finished PCB. Any conventional solder mask process can be used to apply the solder mask 11. In some embodiments, the same material used to form the solder mask frame 14 is used for the solder mask 11. Alternatively, different material than the solder mask frame 14 is used for the solder mask 11.

Figure 5:

In FIG. 5, the solder mask frame 14 is formed on the inner core structure 12. In particular, the solder mask frame is formed on a portion of the patterned interconnect 9 of the inner core structure 12, as shown in FIG. 5. As shown in FIG. 5, a lateral inner boundary of the solder mask frame is laterally offset from lateral inner edge of the patterned interconnect 9 most-proximate to the inner core circuitry 8. Offsetting the solder mask frame from the inner edge of the patterned interconnect 9 provides a target area 13 on the conductive layer material to which a subsequent routing is directed. Alternatively, the solder mask frame is not offset relative to the inner edge of the underlying conductive layer.

Figure 6:
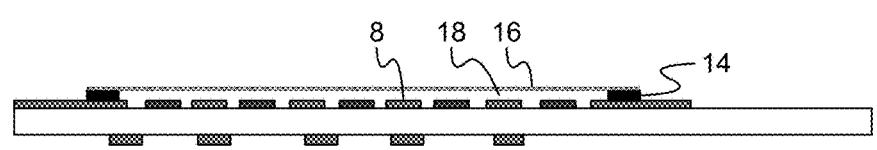

In FIG. 6, the protective film 16 is positioned on the solder mask frame 14 and over the inner core circuitry 8. An air gap 18 is formed between the inner core circuitry 8 and the protective film 16 such that the protective film 16 does not contact the inner core circuitry 8. The protective film 16 is then laminated to the solder mask frame 14. In some embodiments, the protective film 16 is polyimide, fully cured prior to the protective film lamination to the solder mask frame. In other embodiments, the protective film 16 is a copper foil. In general, the protective film can be any material with sufficient rigidity to cover the inner core circuitry and retain the air gap, as well as enable sufficient lamination to the underlying solder mask frame.

Figure 7:
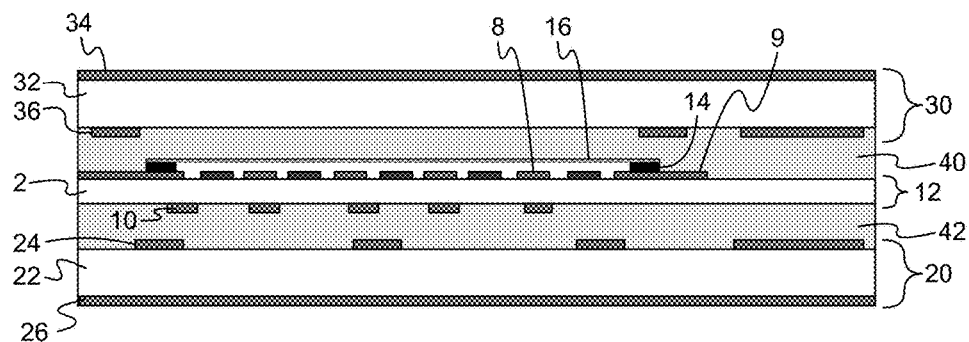

In FIG. 7, additional core structures are fabricated. The additional core structures can be similar to the inner core structure 12 of FIG. 3 with the conductive layers pattern etched accordingly. In most instances, the additional core structures are made using a non-conductive base material. In the exemplary configuration shown in FIG. 7, two additional core structures 20 and 30 are included. The core structure 20 is a metal clad structure including a non-conductive layer 22 and conductive layers 24, 26 formed on both opposing surfaces. The conductive layer 24 is selectively pattern etched. The core structure 30 is a metal clad structure including a non-conductive layer 32 and conductive layers 34, 36 formed on both opposing surfaces. The conductive layer 36 is selectively pattern etched. It is understood that alternatively configured core structures can be used which include a conductive layer on only one surface of the non-conductive layer.

The inner core structure 12 with solder mask frame 14 and protective film 16, the core structure 20 and the core structure 30 are stacked with intervening non-conductive layers, such as regular flow prepreg layers 40 and 42. As described above, the dimensions of the cavity are determined by the thicknesses and numbers of non-conductive layers between the protective film and the outer surface of the laminated stack into which the cavity is formed, as well as the position and shape of the solder mask frame.

A single lamination step using standard lamination pressure results in the laminated stack shown in FIG. 7. Any conventional lamination technique can be used. As used herein, standard lamination pressure refers to the lamination pressure used with "regular flow" prepreg. With "regular flow" prepreg, lamination pressure is less than about 450 psi. With "low flow" prepreg, lamination pressure is more than about 450 psi.

Figure 8:
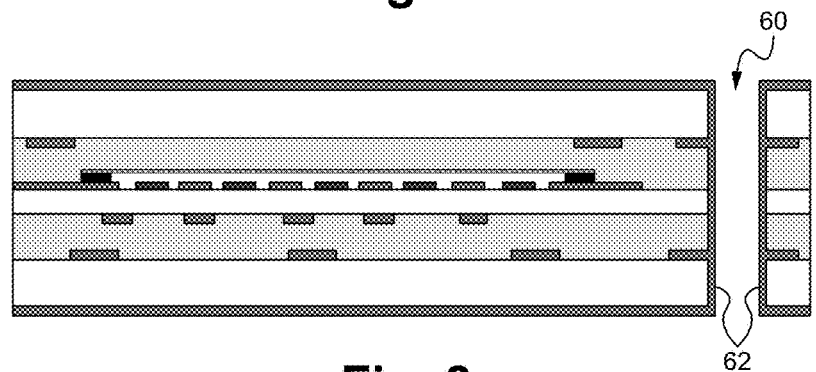

In FIG. 8, selective holes are drilled through the laminated stack of FIG. 7 to form vias, such as via 60. Vias can be formed in those portions of the PCB not corresponding to a cavity. A desmear process is performed to remove residue, such as residual particles from the drilling of via 60. Next, an electroless plating process is performed to form plating 62 on the side walls of the via 60. In some embodiments, copper is used as the plating material. It is understood that other plating materials can be used. The plating 62 forms an interconnect with various conductive layers in the stack.

Figure 9:
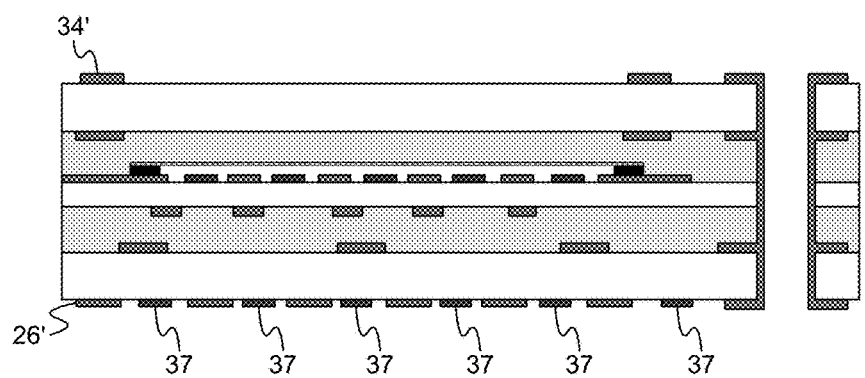

In FIG. 9, an outer conductive layer etching process is performed. The conductive layers 34 and 26 on the top and bottom, respectively, of the laminated stack are pattern etched to form patterned conductive layers 34' and 26'. An optional solder mask 37 can be applied to the patterned conductive layer 26'.

Figure 10:
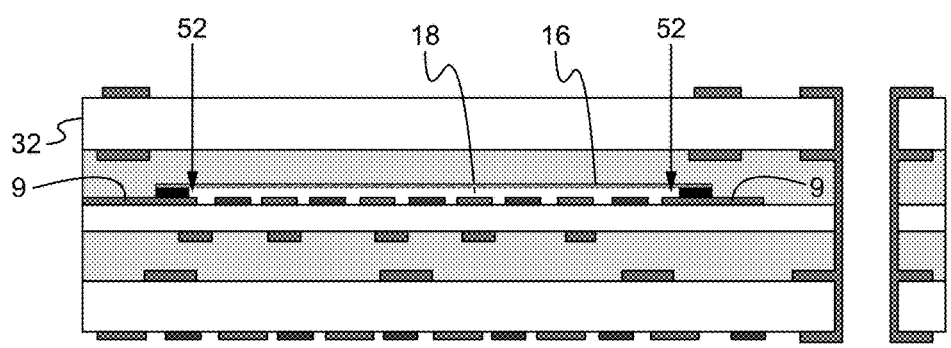

In FIG. 10, a depth controlled rout step is performed. In some embodiments, a routing tool having a rout bit is used to form a rout into the laminated stack to a depth of the patterned interconnect 9 on the respective inner core structure 12. Alternatively, a laser or a mechanical plus laser depth controlled routing process is performed. As shown in FIG. 10, a rout 52 is made from the non-conductive layer 32 to the patterned interconnect 9 of the inner core structure 12. FIG. 10 shows a two dimensional view of the rout 52. In three-dimensions, the rout 52 is formed proximate, and preferably slightly within, the lateral inner edge of the solder mask frame 14, such as at target area 13 (FIG. 5) on the patterned interconnect 9.

Figure 11:
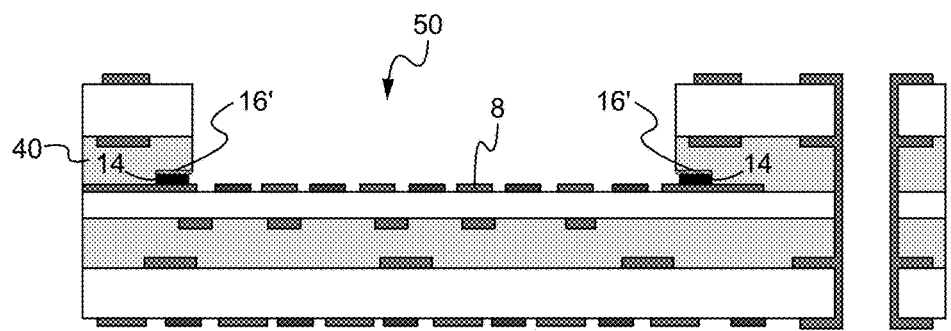

In FIG. 11, a plug is removed from the laminated stack, thereby forming the cavity 50. The plug is the area within the rout 52 perimeter and between the non-conducive layer 32 and the patterned interconnect 9 of the inner core structure 12. Removal of the plug is referred to as a decap process. The gap 18 (FIG. 10) between the protective film 16 and the inner core circuitry 8 enables the plug to simply be pulled out from the laminated stack. The solder mask frame 14 and a portion 16' of the protective film remain after the decap process. The inner core circuitry 8 is exposed within the recessed cavity 50.

It is understood that the various structural configurations shown in the embodiments of FIGS. 1-11 and the position of the recessed cavity can be different according to a specific application and application requirement.

The PCB and manufacturing processes described herein provide numerous advantages. The PCB having a solder mask frame and protective film to form a recessed cavity is formed using regular flow prepreg. In prior art PCBs, a PCB having a recessed cavity is formed using low flow prepreg as well as lamination accessories such as release film and conformal film. Use of low flow prepreg is needed to control squeeze out during lamination. However, since low flow prepreg is used, a greater lamination pressure is required which results in surface ripple on the PCB exterior surfaces. Under high pressure the underlying topography of the inner layer circuitry is reflected on the surface resulting in the irregular, or rippled, surface. In the present application, there is no need to control resin squeeze out, there is no limitation in prepreg selection, and there is no need of lamination accessories or high lamination pressure, which results in a flat exterior surface. The present process improves board flatness that solves impedance control issues and improves reliability of surface mounted component connections. Yield of fine line 2/2 mil etching and solder mask fine line imaging is also improved because of the flat exterior surfaces. Without use of lamination accessories and with yield improvement, the process of the present application saves running cost dramatically. Higher pressure lamination as used in conventional processes leads to expansion in the X-Y plane of the PCB. Such lateral expansion moves surface contact pads relative to their designed positions. The present process uses standard lamination pressure and therefore reduces lateral expansion. Such dimensional control is becoming more and more significant with smaller and smaller pitch components to be surface mounted.

The present application has been described in terms of specific embodiments incorporating details to facilitate the understanding of the principles of construction and operation of the printed circuit board. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A printed circuit board comprising: a. a laminated stack comprising a plurality of non-conductive layers and a plurality of conductive layers, wherein a recessed cavity is formed in the laminated stack, the recessed cavity having cavity side walls and a cavity bottom surface, further wherein inner core circuitry is formed on the cavity bottom surface; b. a photo imageable polymer structure formed within the laminated stack, wherein the photo imageable polymer structure is a solder mask frame, further wherein the photo imageable polymer structure forms a perimeter boundary of the recessed cavity within the cavity side walls adjacent to the cavity bottom surface; and c. a protective film on the photo imageable polymer structure and formed within the laminated stack.

2. The printed circuit board of claim 1 wherein the recessed cavity is formed from an outer surface of the laminated stack into the laminated stack.

3. The printed circuit board of claim 1 wherein the photo imageable polymer structure is formed on a surface of one of the plurality of conductive layers.

4. The printed circuit board of claim 3 wherein the one of the plurality of conductive layers on which the photo imageable polymer structure is formed comprises a first portion on which the photo imageable polymer structure is formed and a second portion comprising the inner core circuitry.

5. The printed circuit board of claim 1 wherein the protective film is polyimide.

6. The printed circuit board of claim 1 wherein one or more of the plurality of non-conductive layers comprise a prepreg layer.

7. The printed circuit board of claim 6 wherein the prepreg layer comprises a regular flow prepreg layer having resin flow greater than about 100 mil.

8. The printed circuit board of claim 1 wherein each of the conductive layers is pattern etched.

9. The printed circuit board of claim 1 further comprising one or more plated through hole vias in the laminated stack.

10. The printed circuit board of claim 1 wherein the protective film is stacked on the photo imageable polymer structure and within the cavity side walls adjacent to the cavity.

11. A printed circuit board comprising:
a. a laminated stack comprising a plurality of non-conductive layers and a plurality of conductive layers, wherein a recessed cavity is formed in the laminated stack, the recessed cavity having cavity side walls and a cavity bottom surface, further wherein inner core circuitry is formed on the cavity bottom surface;
b. a photo imageable polymer structure formed within the laminated stack, wherein the photo imageable structure forms a perimeter boundary of the recessed cavity within the cavity side walls adjacent to the cavity bottom surface, further wherein the photo imageable polymer structure is formed on a surface of one of the plurality of conductive layers; and
c. a protective film on the photo imageable polymer structure and formed within the laminated stack.

12. The printed circuit board of claim 11 wherein the recessed cavity is formed from an outer surface of the laminated stack into the laminated stack.

13. The printed circuit board of claim 11 wherein the one of the plurality of conductive layers on which the photo imageable polymer structure is formed comprises a first portion on which the photo imageable polymer structure is formed and a second portion comprising the inner core circuitry.

14. The printed circuit board of claim 11 wherein the protective film is polyimide.

15. The printed circuit board of claim 11 wherein one or more of the plurality of non-conductive layers comprise a prepreg layer.

16. The printed circuit board of claim 11 wherein the prepreg layer comprises a regular flow prepreg layer having resin flow greater than about 100 mil.

17. The printed circuit board of claim 11 wherein each of the conductive layers is pattern etched.

18. The printed circuit board of claim 11 further comprising one or more plated through hole vias in the laminated stack.

19. The printed circuit board of claim 11 wherein the protective film is stacked on the photo imageable polymer structure and within the cavity side walls adjacent to the cavity.

* * * * *